United States Patent
Byquist et al.

(10) Patent No.: US 8,739,392 B2
(45) Date of Patent: Jun. 3, 2014

(54) CAST GRID ARRAY (CGA) PACKAGE AND SOCKET

(75) Inventors: Tod Byquist, Federal Way, WA (US); Daniel P. Carter, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/459,396

(22) Filed: Jun. 30, 2009

(65) Prior Publication Data

US 2010/0330823 A1 Dec. 30, 2010

(51) Int. Cl.
*B23P 19/00* (2006.01)

(52) U.S. Cl.
USPC ............ 29/739; 29/740; 29/741; 29/842; 361/719

(58) Field of Classification Search
USPC ............ 29/729, 739, 740–743; 257/700, 266; 361/704, 786, 715–71; 439/342, 487; 228/180.21–180.22
See application file for complete search history.

(56) References Cited

U.S. PATENT DOCUMENTS

| | | | |
|---|---|---|---|
| 5,413,489 A * | 5/1995 | Switky | 439/71 |
| 5,626,278 A * | 5/1997 | Tang | 228/56.3 |
| 5,718,367 A * | 2/1998 | Covell et al. | 228/254 |
| 5,773,889 A * | 6/1998 | Love et al. | 257/737 |
| 6,219,241 B1 * | 4/2001 | Jones | 361/704 |
| 6,548,891 B2 * | 4/2003 | Mashino | 257/700 |
| 6,969,267 B2 * | 11/2005 | Byquist | 439/73 |
| 7,350,299 B2 * | 4/2008 | Renfro et al. | 29/874 |
| 7,392,582 B2 | 7/2008 | Hoppe | |
| 7,667,982 B2 * | 2/2010 | Hamasaki et al. | 361/803 |
| 2005/0181544 A1 * | 8/2005 | Haba et al. | 438/127 |

FOREIGN PATENT DOCUMENTS

| | | |
|---|---|---|
| CN | 101268548 A | 9/2008 |
| CN | 101969056 A | 2/2011 |
| TW | 201115695 A | 5/2011 |

OTHER PUBLICATIONS

Office Action received for Chinese Patent Application No. 201010265746.7, mailed on Nov. 17, 2011, 12 Pages including 8 pages of English Translation.
Office Action received for Taiwan Patent Application No. 99120469, mailed on Oct. 8, 2013, 9 Pages of Office Action including 4 pages of English Translation.
Office Action received for Taiwan Patent Application 99120469, mailed on Jan. 15, 2013, 11 pages of Office Action including 5 pages of English translation.
Office Action received for Japan Patent Application No. 201010265746.7, mailed on Feb. 28, 2013, 11 pages of Office Action including 7 pages of English translation.
Non Final Office Action received for Chinese Patent Application No. 201010265746.7, mailed on Nov. 17, 2011, 12 Pages (8 pages of English Translation).
Office Action Received for Chinese Patent Application No. 201010265746.7, mailed on Sep. 19, 2012, 7 pages of Office Action and 9 pages of English translation.

* cited by examiner

*Primary Examiner* — Minh Trinh
(74) *Attorney, Agent, or Firm* — Jordan IP Law, LLC

(57) ABSTRACT

A cast grid array (CGA) package comprises shaped solder posts which may be reflowed and connected directly to a circuit board, such as mother board, or remain in a solid state with the shape allowing them to be secured within a CGA socket which, in turn, may be connected to the a board. Embodiments of the CGA allows for a lower cost socket and package combination by using solder post to interface the socket and not requiring a loading mechanism on every socket.

6 Claims, 9 Drawing Sheets

CAST GRID ARRAY (CGA) PACKAGE AND SOCKET

FIELD OF THE INVENTION

Embodiments of the present invention are directed to integrated circuit (IC) packages and, more particularly, to a central processing unit (CPU) package which may be soldered directly to a board or installed into a mechanical socket.

BACKGROUND INFORMATION

Semiconductor manufacturers currently employ two primary technologies for central processing unit (CPU) packages. The first is referred to as pin grid array (PGA) sockets and the second is commonly referred to as land grid array (LGA) sockets.

Pin Grid Array sockets use high strength pin grid arrays attached the bottom of the package which are then engaged into a pin grid array socket. The pins are loaded laterally within the socket which adds height, cost and complexity to the socket. The pins also add cost to the package. PGA packages typically have a greater assembly and material cost due to the pins. In addition, there are limitations on the pin pitch and number of pins that can realistically be manufactured.

LGA packages may be less costly since there may be no holes, rather, pins on the LGA touch contact points on the underside of the CPU and are retained in the socket by either an integral loading scheme such as the direct socket loading (DSL) for socket T or an independent loading mechanism (ILM) with a back plate as adopted for socket B. Socket T and Socket B refer to two types of currently used socket variations. LGA use lands on the bottom of the package but the contacts need a relatively high normal force throughout the life of the socket to maintain electrical continuity. The high normal force usually requires a relatively expensive loading solution for each socket and historically a load spreader or integrated heat spreader has been used to distribute the enabling load across the array of the contacts. The load/heat spreaders add cost to the package and the socket loading mechanisms add cost the socket/platform.

Thus, semiconductor manufacturers are constantly striving to find affordable new ways to secure a CPU reliably in a confined area.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is a cast grid array (CGA) package which may be connected directly to a circuit board, such as mother board, or secured within a CGA socket which, in turn, is connected to a board. Embodiments of the CGA allows for a lower cost socket and package combination by using solder post to interface the socket and not requiring a loading mechanism on every socket.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
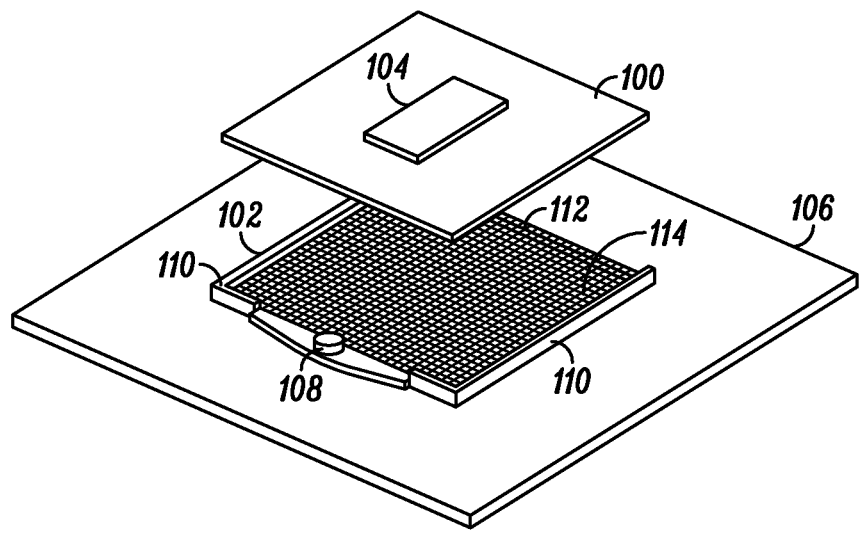
FIG. 1 is a plan view of a cast grid array (CGA) package and a corresponding CGA socket on a board.

Referring now to FIG. 1, there is shown a view of the cast grid array (CGA) package 100 and the corresponding CGA socket 102. The CGA package may electrically and mechanically carry an IC, such as a CPU 104. The CGA socket 102 may be secured to a circuit board, such as a mother board 106. The CGA socket 102 may include a release mechanism 108 for aiding in removal of the package 100 from the socket 102.

The socket 102 may comprise a polymer housing having a lip 110 on three sides and being open on the remaining forth side 112 opposite the release mechanism 108. The topside of the housing may contain an array of electrical contacts 114 for engaging electrical posts (not shown), such as specially shaped solder posts, on the underside of the CGA package 100. The lip 110 may be useful for providing initial alignment of the CGA package 100 with the CGA socket 102.

In one embodiment, the CGA package 100 may be secured within the CGA socket 102 with a spring force of the electrical contacts 114 using an insertion tool later described. In other embodiment, the CGA package 100 may be secured directly to the board 106, such as by reflowing the specially shaped solder posts, without the CGA socket 102.

Figure 2:
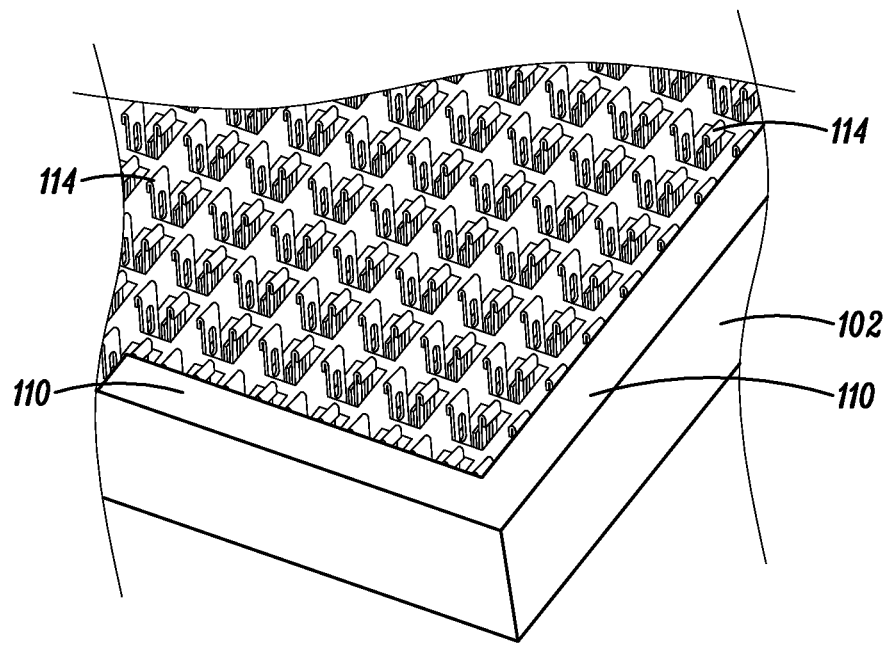
FIG. 2 is a close up view of the array of contacts on the CGA socket.

FIG. 2 shows a close-up view of one corner of the CGA socket 102. The lip 110 provides a raised edge around the socket 102. The array of contacts 114 may be arranged in columns and rows within the socket 102 to correspond to solder posts on the underside of the package 100. The socket also is shaped to accommodate an insertion tool later described.

Figure 3:
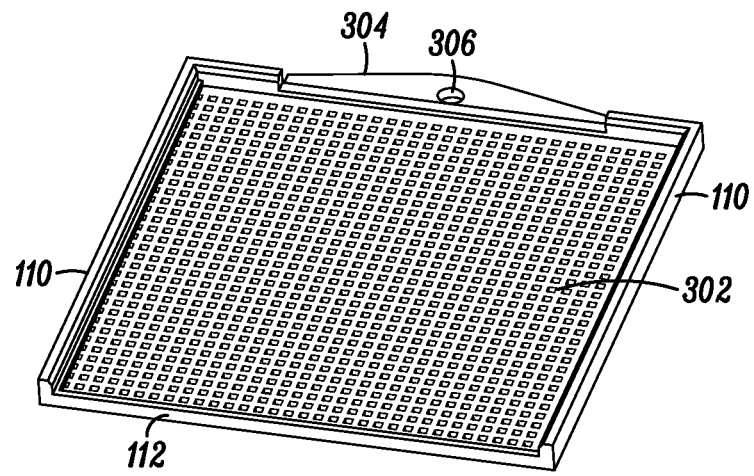
FIG. 3 is a plan view of the housing for the CGA socket according to one embodiment.
Figure 4:
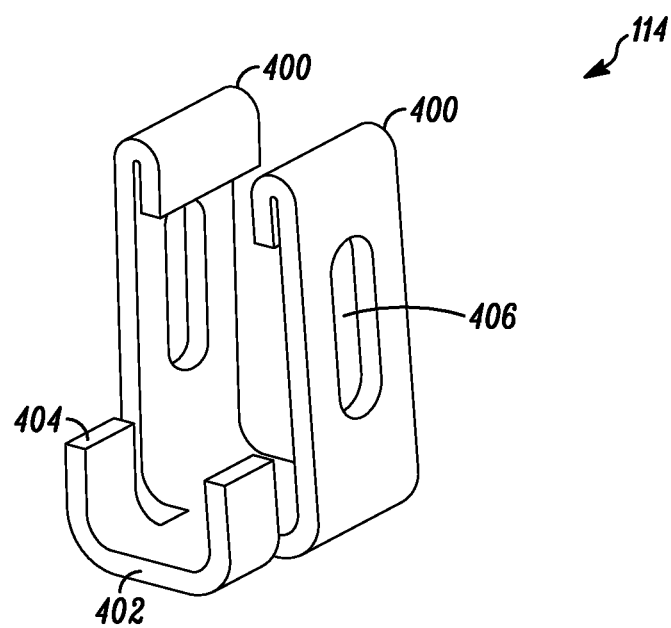
FIG. 4 is a plan view of a contact for the CGA socket according to one embodiment.

FIGS. 3 and 4 show plan views of the CGA socket housing 300 and one embodiment of the contacts 114 that make up the array of contacts 114 that fit into openings 302 in the socket housing 300. In one embodiment, the socket housing may be a cast or molded polymer having a raised edge or lip 110 on three sides and open on the forth side 112. On the side opposite the open side 112, there may be a break in the lip 304 which may include a slot 306 for a release mechanism (108, FIG. 1).

FIG. 4 shows one embodiment of a contact 114 that fits within the slots 302 of the CGA socket housing 300. The contacts 114 may comprise a double beam element being generally U-shaped and may be tapered at the tops of the beams 400. The base of the contact 402 may include a second retention portion 404 which may also be generally U-shaped and which may provide mechanical stability and robustness when secured within the slots 302 of the CGA socket housing 300. Openings 406 may also be optionally included in each of the double beams for structural integrity. The tapered edges 400 may be shaped to engage a solder post on the underside of the CGA package 100 and provide a spring force to hold the post in place. In addition to mechanically securing the CGA package 100, the contacts also provide an electrical path between a board the CGA package 100 when in operation.

Figure 5:
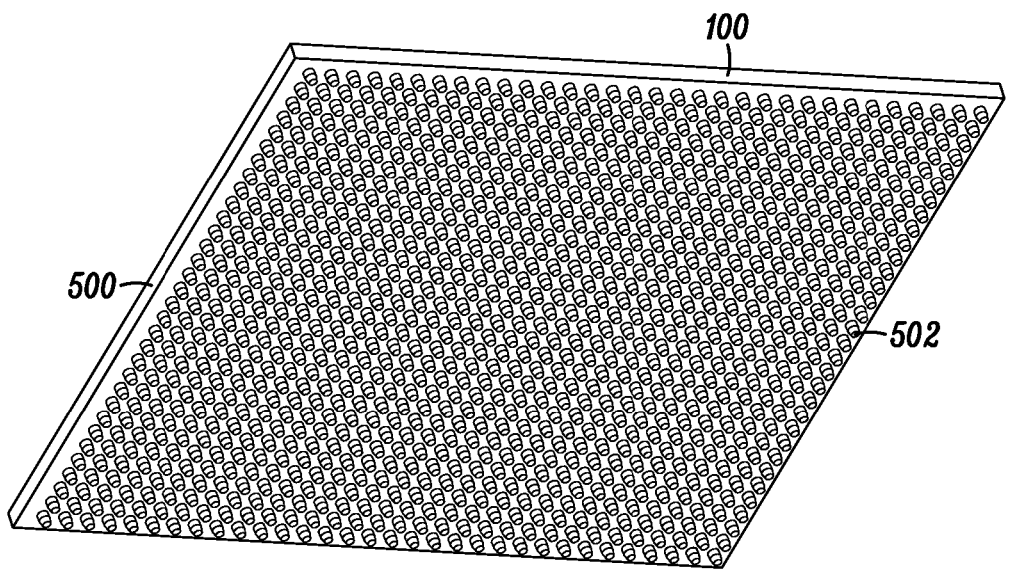
FIG. 5 is a plan view of the underside of the CGA package.
Figure 6:
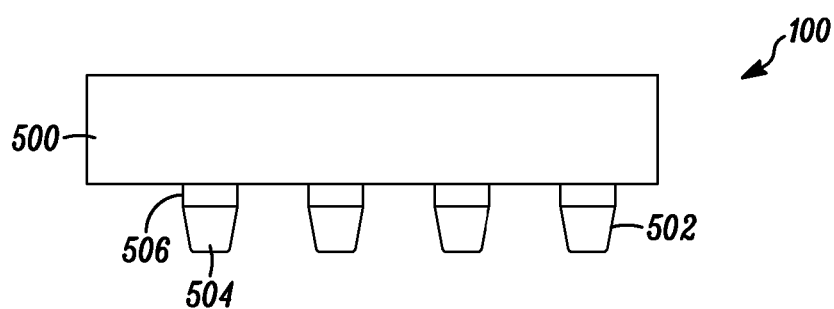
FIG. 6 is a side view of the CGA package showing the tapered molded solder post according to one embodiment.

FIGS. 5 and 6 show embodiments of the underside of the CGA package 100 which comprises a substrate or base 500 which includes an array of posts 502. A molding or cast process may be used to form the solder posts 502 into a preferred shape that may be conical at the tips 504 and transitions to cylindrical in shape at the base 506 where it attaches to the substrate 500. This shape may allow both reflow (if the CGA package 100 is to be attached directly to a board 106, FIG. 1) or if the posts 502 are to be inserted into the contacts 114 of the CGA socket 102 as previously described.

The volume each solder post 502 may be the same as a standard spherical solder ball which allows the package to be reflowed or inserted into the socket. The casting process can also be used to take out package flatness variability as the cast posts will be as accurate as the molding tool which can be manufactured to very accurate tolerances. A mold which may be used to form the posts 500 may be made of a material selected to match the Coefficient of Thermal Expansion of the package as well as coated with a release surface such as Teflon to allow for removal without distortion of the posts 502.

Figure 7A:
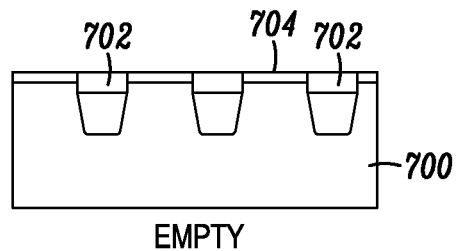
FIGS. 7A-7F are views showing one process for fabricating the CGA package with molded solder posts.

FIGS. 7A-7F illustrate one embodiment for casting the CGA package 100. In FIG. 7A, a mold 700 is provided that may be made, for example of steel. The top side of the mold 700 may include an array of openings 702, each patterned in the reverse mold shape of the post 502 and may be coated with a low friction coating, such as Teflon®, for ease of release. A seal 704 may cover the area around the openings to keep the area around the final posts solder free.

Figure 7B:
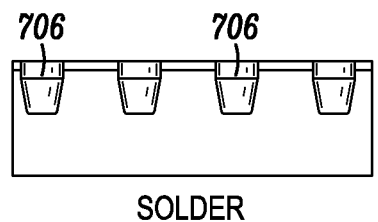
Figure 7C:
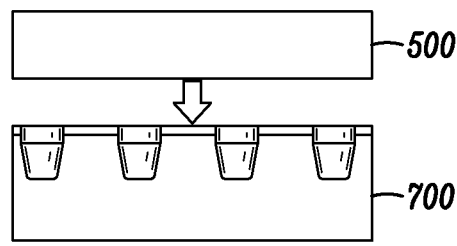
Figure 7D:
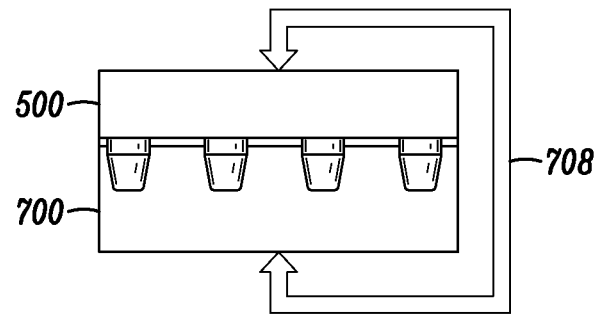
Figure 7E:
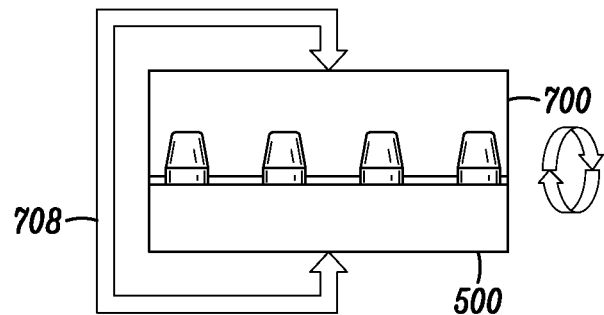
Figure 7F:
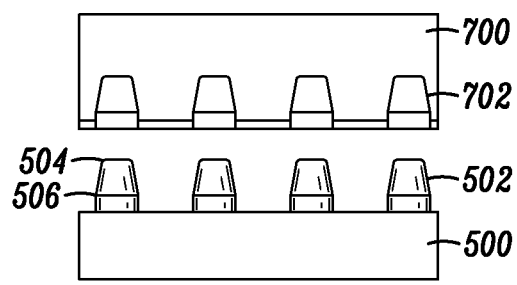

In FIG. 7B, solder 706 is reflowed and the openings 702 are filled with the solder 706. In FIG. 7C, the substrate 500 is placed on top of the mold 700 and in FIG. 7D, the substrate 500 and the mold are clamped 708 together. In FIG. 7E, the mold 700 may be inverted to allow gravity to fill the substrate 500. Finally, in FIG. 7F, the mold is cooled and released, thus forming the CGA package 100 which comprises a substrate or base 500 with the array of posts 502 that may be conical at the tips 504 and transitions to a cylindrical in shape at the base 506 where it attaches to the substrate 500.

Figure 8:
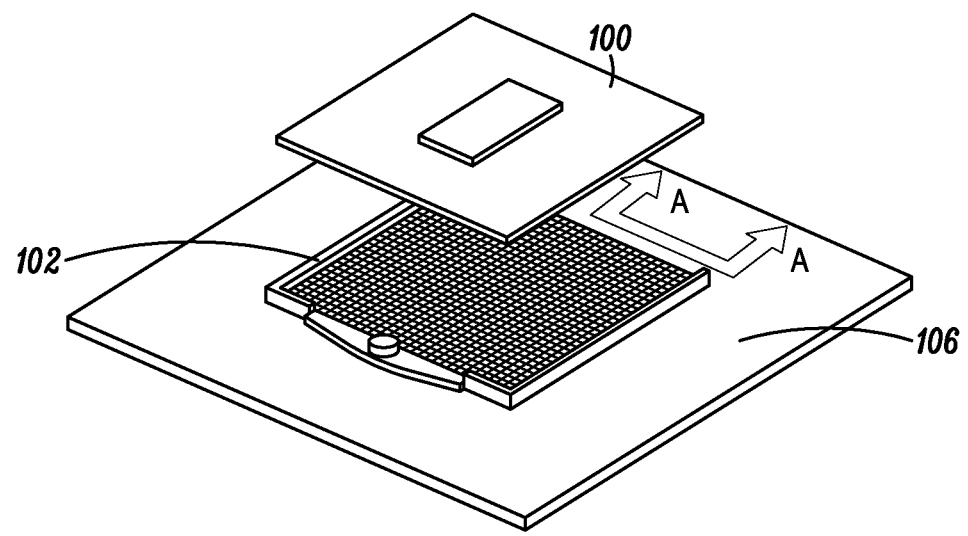
FIG. 8 is a plan view of the cast grid array (CGA) package and a corresponding CGA socket on a board ready for assembly.
Figure 9:
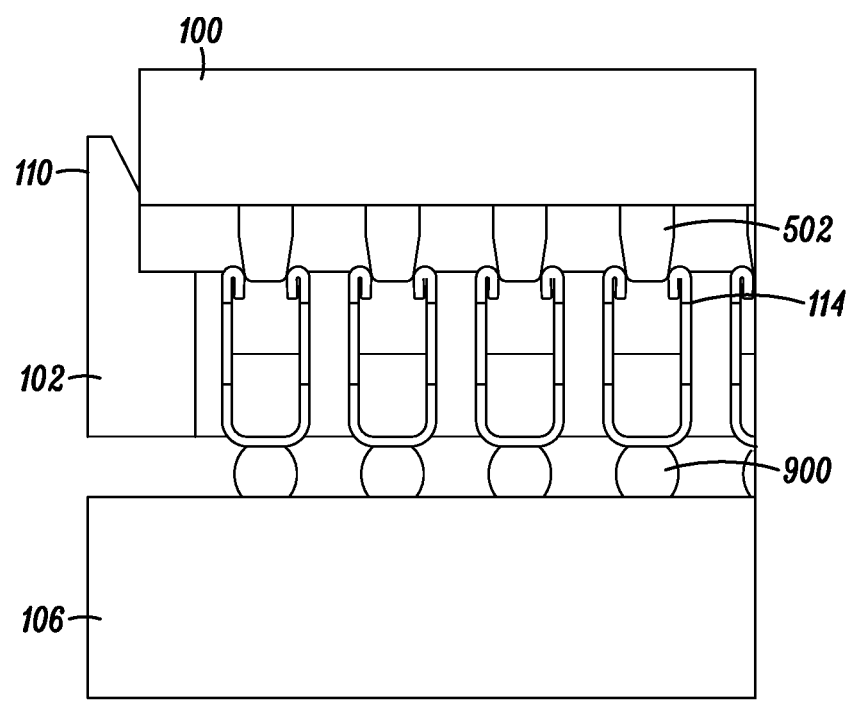
FIG. 9 is a cross sectional view of the CGA package and socket taken along sectional lines A-A' of FIG. 8.

Referring now to FIGS. 8-12, there is illustrated one embodiment of the CGA assembly process. FIG. 8 shows the CGA socket 102 mounted to the board 106 with the CGA package 100 placed on top. FIG. 9 shows a cross-sectional view taken along line A-A' in FIG. 8. The CGA socket 102 may be secured to the board 106 with traditional solder bumps 900. The CGA package may be initially aligned into the CGA socket with the aid of lip 110. The lip 110 may have a beveled top edge as shown. When initially inserted, the solder posts 502 may just make contact with the contacts 114.

Figure 10:
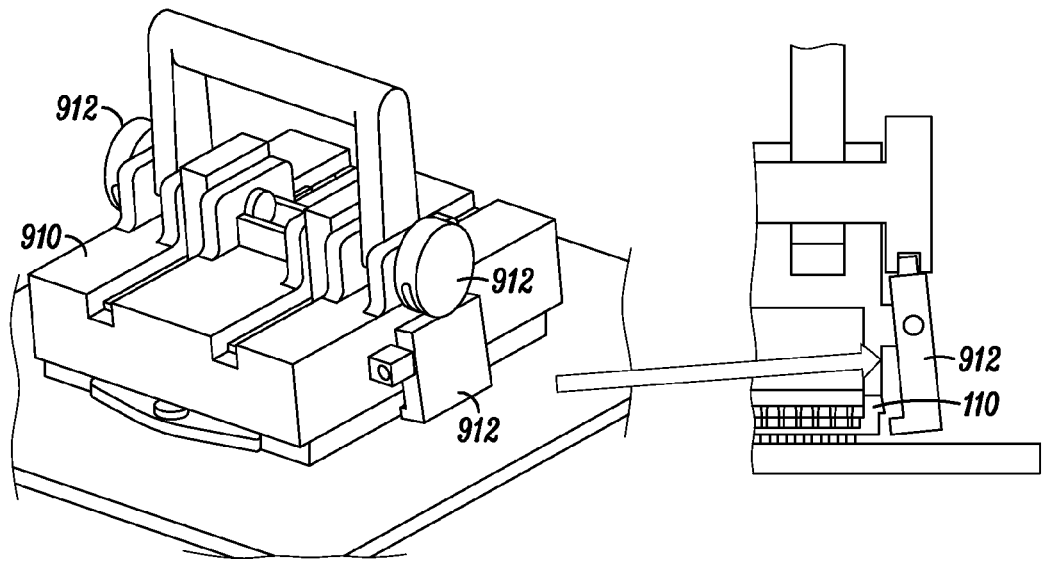
FIG. 10 is a plan view of one embodiment of an assembly tool for seating the CGA package in the socket.
Figure 11:
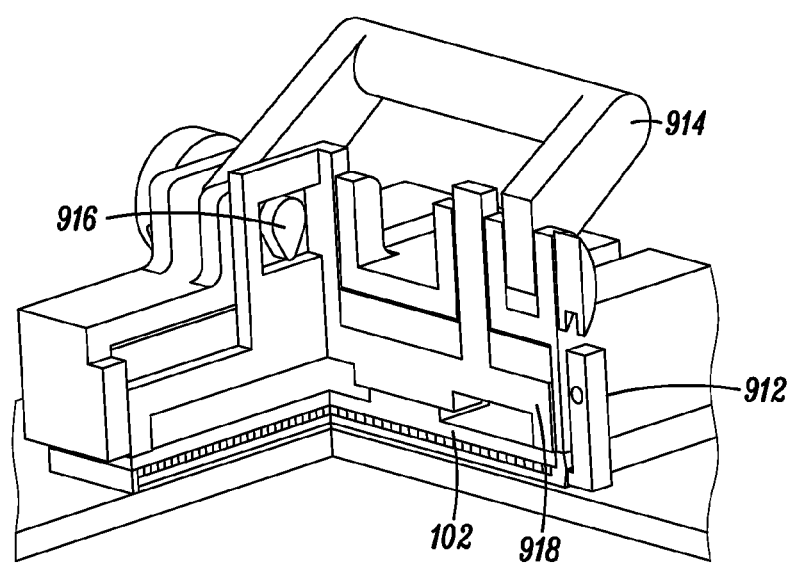
FIG. 11 is a cut-away view of the assembly tool.

As shown in FIG. 10, an insertion tool 910 may be used to firmly seat the CGA package 100 into the socket 102. FIG. 10 shows one example of a possible insertion tool 110, however, many variations of such a device may be employed, so long as it applies a downward force sufficient to seat the package 100. As shown, the insertion tool 910 is shaped to generally fit over the package 100 and socket 102. Cammed latches 912 on either side of the tool 910 may be situated to engage a ledge projected from the lip 110 of the socket 102. As shown in FIG. 11, when a handle 914 is rotated, the latch 912 moves inward to grasp the socket 102. A cam mechanism 916 within the tool 910 rotates to push down a plate 918 and apply a downward pressure to the CGA package 102. The handle 914 is rotated back and the latches 912 are disengaged to allow removal of the tool 910.

Figure 12:
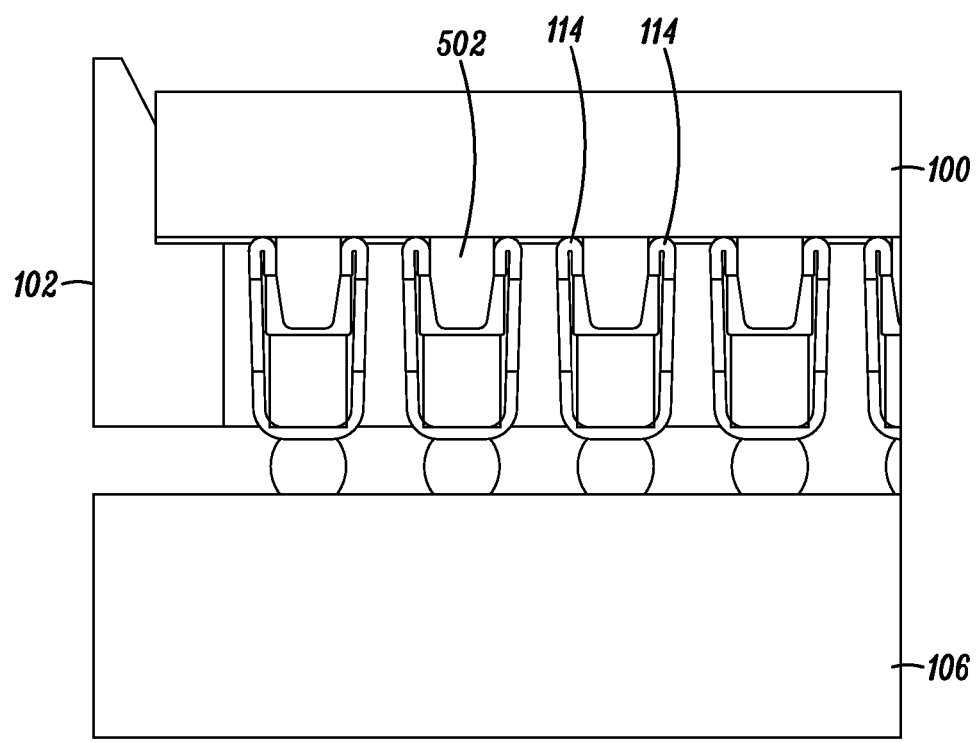
FIG. 12 is a cross sectional view of the CGA package and socket after assembly taken along sectional lines A-A' of FIG. 8.

FIG. 12 shows the package 100 inserted into the socket 102 also taken along cross sectional line A-A' of FIG. 8. As shown, the contacts 114 firmly hold the package 100 within the socket 102. The conical tip of the molded solder posts 502 aid in initial mating with the contacts 114 and the cylindrical base of the contacts 502 have sufficient girth that the spring force of the contacts 114 holds them in place. As shown, the according to embodiments this system has a low profile which may be only approximately 1.4 mm in height from motherboard 106 to package 100.

Figure 13:
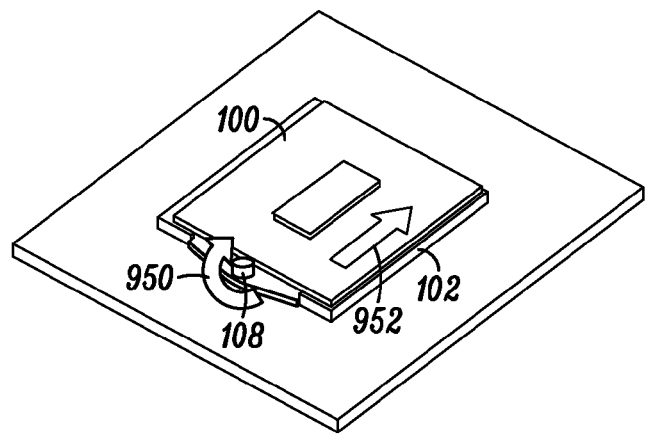
FIG. 13 is a plan view of the cast grid array (CGA) package and a corresponding CGA socket on a board ready for disassembly.
Figure 14:
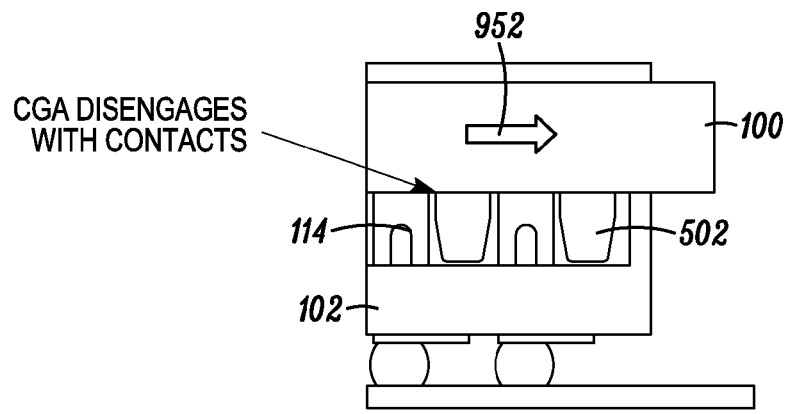
FIG. 14 is a cross sectional view of the CGA package and socket showing the solder posts disengaging from the contacts.
Figure 15:
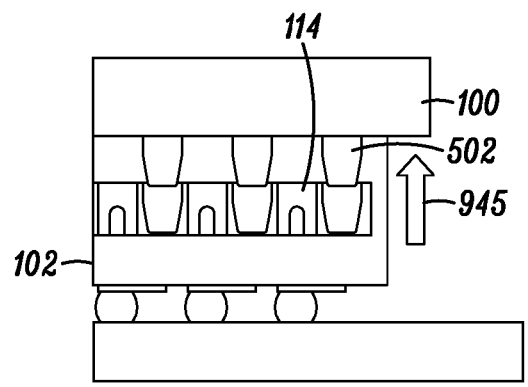
FIG. 15 is a cross sectional view of the CGA package being lifted from the socket with zero force on the solder posts.

FIGS. 13-15 illustrate one embodiment disengaging the package 100 from the socket 102. As shown in FIG. 13, the package 100 is secured to the socket 102 on the board 106. To remove the package 100, the release mechanism 108 may be simply turned as shown by the curved arrow 950. The release mechanism 108 may be a cam which when turned applies a lateral force to the package 100 as illustrated by arrow 952. This causes the package 100 to slide toward the end of the socket 102 that has no lip 112.

As shown in FIG. 14, as the package slides forward, the solder posts 502 slides laterally out of the contacts 114. Thereafter, as shown in FIG. 15, the package 100 may simply be lifted out of the socket 102 as illustrated by arrow 954 with zero force on the solder posts 502.

Embodiments of the invention combine a solder shape reforming process to allow for socket installation or direct solder attach to the motherboard. The socket design may use an assembly tool to reduce the unit cost of every socket and overall lower the vertical height of the socket.

In some embodiments, the contacts 114 may comprise a high performance copper alloy (C70250) to create a self reacting force of approximately 0.15 to 0.20 N (15 to 20 gmf) on each side of the solder post cylinder to create and maintain electrical contact. In one case study of a 33×33 array for a total of 1089 contacts on a pitch of 0.914 mm (36 mil) overall package insertion force is approximately 39 lbf which is not overly difficult to generate with a mechanical advantage tool.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A system for packaging an integrated circuit (IC) chip, comprising:
    a package configured to house an integrated circuit on a top side;
    a plurality of cast solder posts on a bottom side of the package,
    wherein each of the cast solder posts has a cylindrical base transitioning to a tapered conical tip; and
    a socket connected to a board wherein the socket comprises a plurality of contacts configured to mate with the plurality of cast solder posts without a need for the cast solder posts to be reflowed to a liquid state and then solidified for connection to the contacts,
    wherein the cast solder posts are sized and shaped to have the ability to be inserted into and thereby securely connected to the socket that is connected to the board without a need for the cast solder posts to be reflowed to a liquid state and then solidified for connection to the socket, and wherein the cast solder posts are sized and shaped to have the ability to be reflowed to a liquid state and then solidified for direct connection to the board.

2. The system as recited in claim 1, wherein the socket comprises:
    a lip surrounding all but one side of the plurality of contacts; and
    a release mechanism positioned opposite the side with no lip to apply a lateral force to the package to disengage the plurality of cast solder posts from the contacts.

3. The system as recited in claim 1 wherein the contacts are generally U-shaped having tapered tips for exerting a spring force of the cylindrical base of the cast solder posts.

4. The system as recited in claim 1, further comprising an insertion tool to be attached to the socket to apply a downward force on the package to seat the package in the socket and then the insertion tool removed.

5. The system as recited in claim 1 wherein the contacts comprise a copper alloy.

6. The system as recited in claim 1 wherein the IC chip is a central processing unit (CPU).

* * * * *

UNITED STATES PATENT AND TRADEMARK OFFICE
CERTIFICATE OF CORRECTION

| | | |
|---|---|---|
| PATENT NO. | : 8,739,392 B2 | Page 1 of 1 |
| APPLICATION NO. | : 12/459396 | |
| DATED | : June 3, 2014 | |
| INVENTOR(S) | : Tod Byquist et al. | |

It is certified that error appears in the above-identified patent and that said Letters Patent is hereby corrected as shown below:

On the Title Page, in item (57), in column 2, in "Abstract", line 5, delete "the a" and insert -- a --, therefor.

Signed and Sealed this
Sixteenth Day of September, 2014

Michelle K. Lee
*Deputy Director of the United States Patent and Trademark Office*